United States Patent
Hung et al.

(10) Patent No.: US 9,875,941 B1
(45) Date of Patent: Jan. 23, 2018

(54) METHOD FOR FABRICATING SEMICONDUCTOR DEVICE

(71) Applicant: UNITED MICROELECTRONICS CORP., Hsin-Chu (TW)

(72) Inventors: Ching-Wen Hung, Tainan (TW); Chih-Sen Huang, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/289,978

(22) Filed: Oct. 11, 2016

(30) Foreign Application Priority Data

Sep. 12, 2016 (TW) .............................. 105129537 A

(51) Int. Cl.
*H01L 21/336* (2006.01)
*H01L 21/8234* (2006.01)
*H01L 21/02* (2006.01)
*H01L 21/033* (2006.01)

(52) U.S. Cl.
CPC .. *H01L 21/823481* (2013.01); *H01L 21/0217* (2013.01); *H01L 21/02164* (2013.01); *H01L 21/0332* (2013.01); *H01L 21/823431* (2013.01)

(58) Field of Classification Search
CPC ......... H01L 21/823431; H01L 27/0886; H01L 29/66795; H01L 21/823481
See application file for complete search history.

(56) References Cited

U.S. PATENT DOCUMENTS

| 9,570,442 B1* | 2/2017 | Liu ..................... H01L 27/0886 |
| 2015/0206954 A1* | 7/2015 | Lin ................... H01L 29/66795 |
| | | 257/365 |
| 2016/0049468 A1* | 2/2016 | Wu .................. H01L 21/76224 |
| | | 257/401 |
| 2017/0162584 A1* | 6/2017 | Pranatharthiharan |
| | | ........................... H01L 27/1104 |

OTHER PUBLICATIONS

I-Ming Tseng, Title of Invention: Semiconductor Device and Method for Fabricating the Same, U.S. Appl. No. 14/844,004, filed Sep. 3, 2015.
Yi-Hui Lee, Title of Invention: Method of Manufacturing a Semiconductor Device Including Forming a Dielectric Layer Around a Patterned Etch Mask, U.S. Appl. No. 14/824,091, filed Aug. 12, 2015.
Ching-Wen Hung, Title of Invention: Method for Fabricating Semiconductor Device, U.S. Appl. No. 14/629,502, filed Feb. 24, 2015.

* cited by examiner

*Primary Examiner* — Selim Ahmed
*Assistant Examiner* — Evan Clinton
(74) *Attorney, Agent, or Firm* — Winston Hsu

(57) ABSTRACT

A method for fabricating semiconductor device is disclosed. First, a first fin-shaped structure and a second fin-shaped structure are formed on a substrate, and a shallow trench isolation (STI) is formed around the first fin-shaped structure and the second fin-shaped structure, a patterned hard mask is formed on the STI. Next, part of the first fin-shaped structure and part of the second fin-shaped structure adjacent to two sides of the patterned hard mask are removed for forming a first recess and a second recess, and a dielectric material is formed into the first recess and the second recess.

10 Claims, 6 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of using a patterned hard mask to remove part of fin-shaped structure adjacent to two sides of the patterned hard mask and then forming dielectric material for forming single diffusion break (SDB) structures.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, fin-shaped structure may be divided and insulating material is deposited to form single diffusion break (SDB) structures. However, current process for forming SDB structures still poses numerous disadvantages such as risk of merging adjacent SDB structures. Hence, how to improve the current fabrication process for resolving this issue has become an important task in this field.

SUMMARY OF THE INVENTION

According to a preferred embodiment of the present invention, a method for fabricating semiconductor device is disclosed. First, a first fin-shaped structure and a second fin-shaped structure are formed on a substrate, and a shallow trench isolation (STI) is formed around the first fin-shaped structure and the second fin-shaped structure, a patterned hard mask is formed on the STI. Next, part of the first fin-shaped structure and part of the second fin-shaped structure adjacent to two sides of the patterned hard mask are removed for forming a first recess and a second recess, and a dielectric material is formed into the first recess and the second recess.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
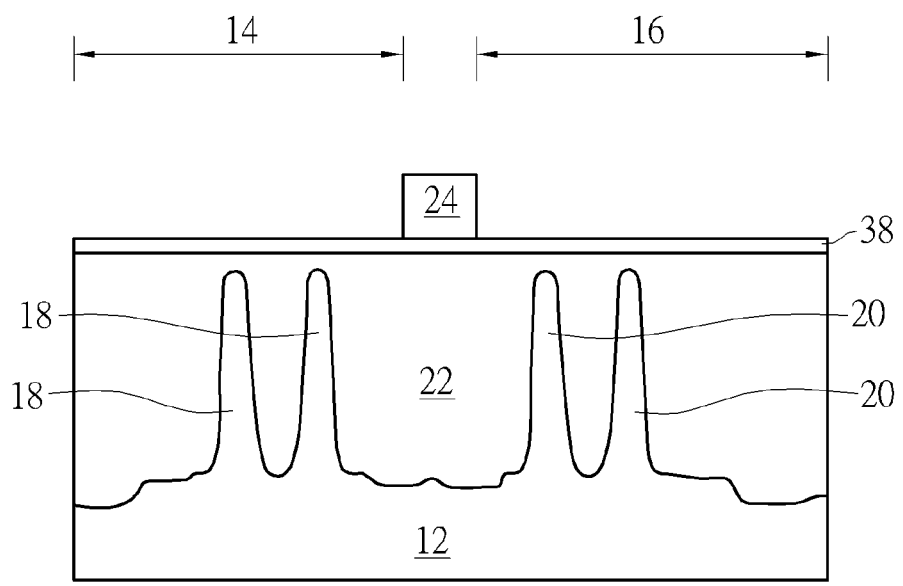
FIGS. 1-7 illustrate a method for fabricating semiconductor device according to a first embodiment of the present invention.

Referring to FIGS. 1-7, FIGS. 1-7 illustrate a method for fabricating semiconductor device according to a first embodiment of the present invention. As shown in FIG. 1, a substrate 12, such as a silicon substrate or silicon-on-insulator (SOI) substrate is first provided. Next, a first region 14 and a second region 16 are defined on the substrate 12, and multiple fin-shaped structures 18 and 20 are formed on the substrate 12 on both first region 14 and second region 16.

Preferably, the number, size, or even position of the fin-shaped structures disposed on the first region 14 could be the same as or different from the fin-shaped structures disposed on the second region 16. For instance, instead of forming two fin-shaped structures 18 on the first region 14 and two fin-shaped structures 20 on the second region 16 as disclosed in this embodiment, the quantity of the fin-shaped structures on each of the regions 14 and 16 could all be adjusted depending on the demand of the product.

Preferably, the fin-shaped structures 18 and 20 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18 and 20 could also be obtained by first forming a patterned mask (not shown) on the substrate, 12, and through an etching process, the pattern of the patterned mask is transferred to the substrate 12 to form the fin-shaped structures 18, 20. Moreover, the formation of the fin-shaped structures 18, 20 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 18, 20. These approaches for forming fin-shaped structure 18. 20 are all within the scope of the present invention.

Next, a shallow trench isolation (STI) 22 is formed around the fin-shaped structures 18, 20. In this embodiment, the formation of the STI 22 could be accomplished by conducting a flowable chemical vapor deposition (FCVD) process to form a silicon oxide layer on the substrate 12 and covering the fin-shaped structures 18, 20 entirely. Next, an etching process or a chemical mechanical polishing (CMP) process is conducted to remove part of the silicon oxide layer so that the top surface of the remaining silicon oxide is even with or slightly higher than the top surface of the fin-shaped structures 18, 20 for forming a STI 22.

Next, an ion implantation process is conducted to implant n-type or p-type dopants into the fin-shaped structures 18, 20, and an anneal process is accompanied to diffuse the implanted dopants for forming well regions (not shown).

Next, a patterned hard mask 24 is formed on the STI 22, in particularly on portion of the STI 22 between the first region 12 and second region 16 or between the fin-shaped structure 18 and fin-shaped structure 20. In this embodiment, the formation of the patterned hard mask could be accomplished by first covering a buffer layer 38 and a hard mask layer (not shown) on the STI 22, and then conducting a pattern transfer process by using a patterned resist (not shown) as resist to remove part of the hard mask layer on the first region 14 and second region 16 so that the remaining hard mask layer forms into the patterned hard mask 24. Preferably, the patterned hard mask 24 includes metal or conductive material such as TiN, and the buffer layer 38 includes silicon oxide, but not limited thereto.

Figure 2:
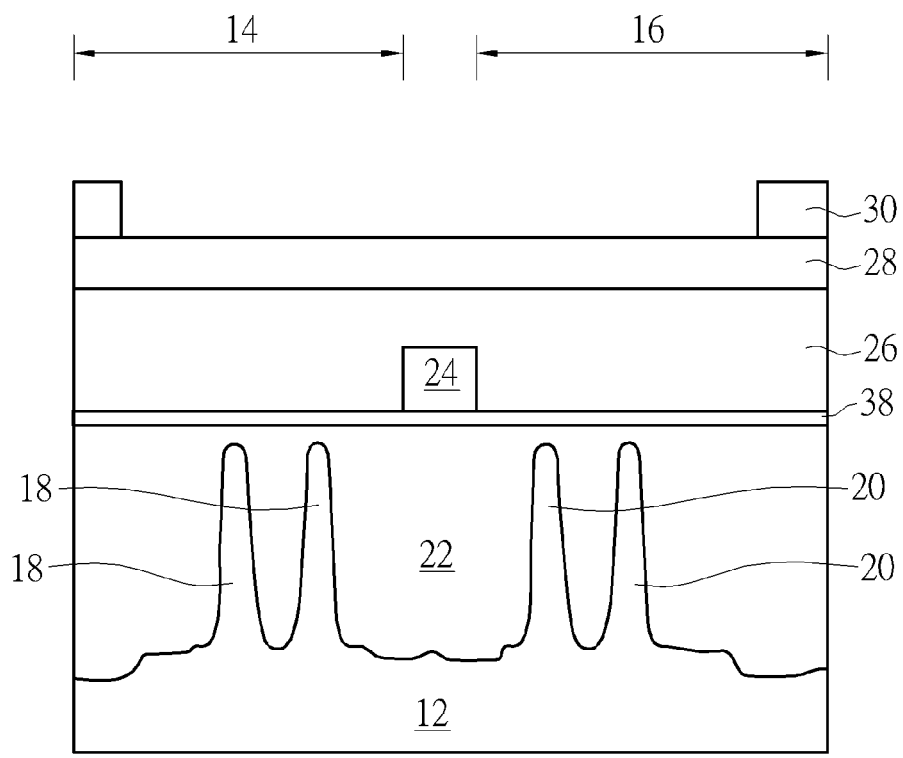

Next, as shown in FIG. 2, a mask layer is formed by sequentially forming an organic dielectric layer (ODL) 26, a silicon-containing hard mask bottom anti-reflective coating (SHB) layer 28, and a patterned resist 30 on the buffer layer 38 to cover the patterned hard mask 24.

Figure 3:
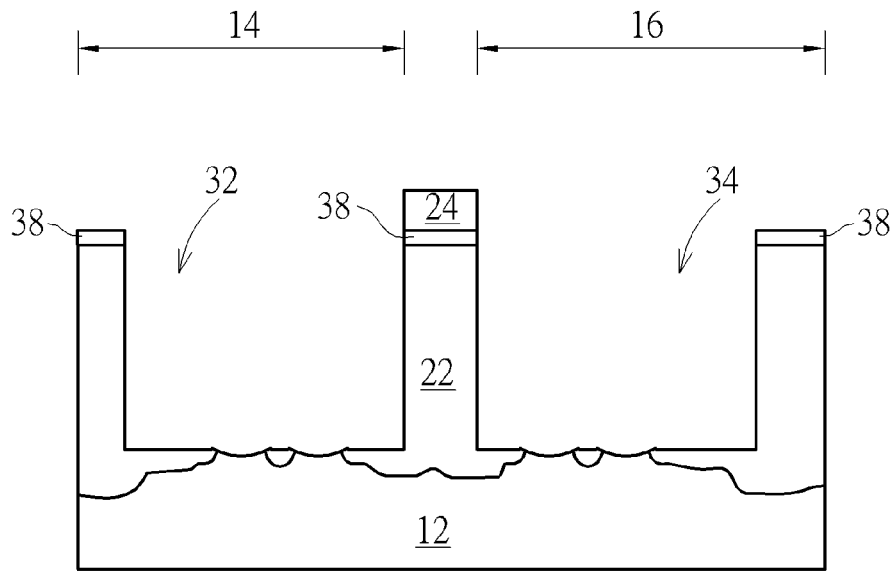

Next, as shown in FIG. 3, an etching process is conducted by using the patterned resist 30 to remove part of the SHB layer 28, part of the ODL 26, part of the buffer layer 38, part of the fin-shaped structure 18 and part of STI 22 on one side of the patterned hard mask 24, and part of the fin-shaped structure 20 and part of STI 22 on the other side of the patterned hard mask 24. This forms a first recess 32 on one side of the patterned hard mask 24 and a second recess 34 on the other side of the patterned hard mask 24. It should be noted that even though an additional buffer layer 38 made of silicon oxide is formed between the patterned hard mask 24 and STI 22 in this embodiment for using as a dual mask, it would also be desirable to omit the formation of the buffer layer 38 by forming only the patterned hard mask 24 on the STI 22 for using as a single mask, and in this instance, the bottom of the patterned hard mask 24 would be even with the top surface of the STI 22.

Figure 4:
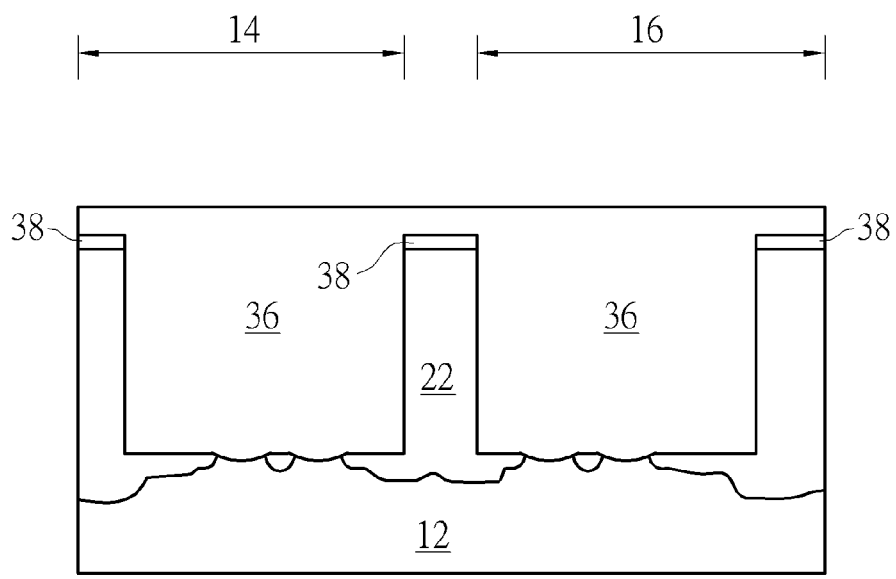

Next, as shown in FIG. 4, a selective etching process could be conducted by using sulfuric acid-hydrogen peroxide mixture (SPM) to completely remove the patterned hard mask 24 and expose the surface of the buffer layer 38 between the first region 14 and second region 16. Next, a dielectric material 36 is deposited into the first recess 32 and second recess 34, in which dielectric material 36 preferably fills the first recess 32 and second recess 34 completely and the top surface of the dielectric material 36 is higher than the top surface of the buffer layer 38. In this embodiment, the dielectric material 36 and STI 22 are preferably made of different material. For instance, the dielectric material 36 filled into the first recess 32 and second recess 34 preferably includes silicon nitride and the STI 22 includes silicon oxide, but not limited thereto.

Figure 5:
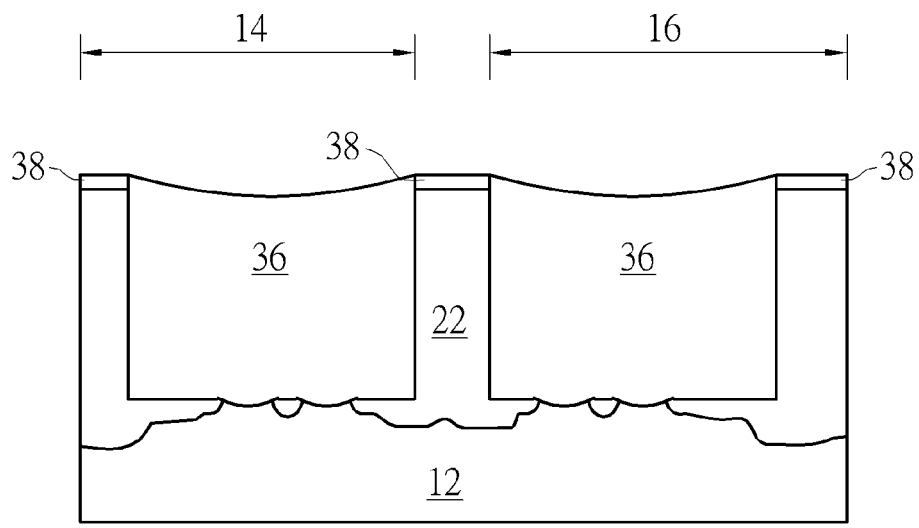
Figure 6:
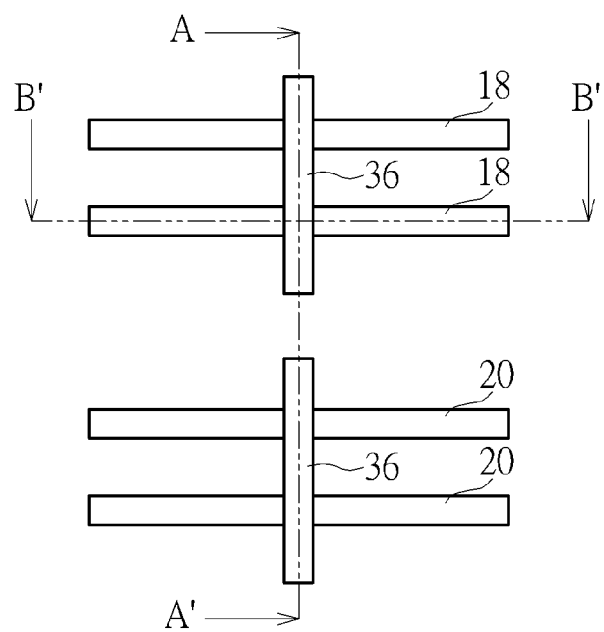
Figure 7:
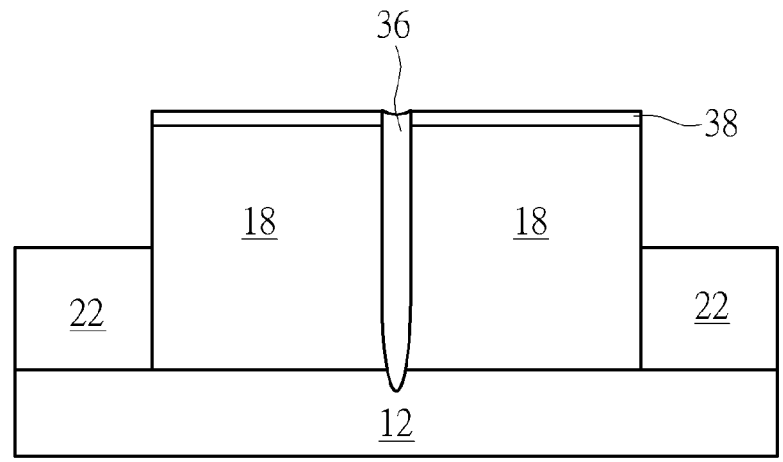

Next, referring to FIGS. 5-7, in which FIG. 6 illustrates a top view of the fabrication process after FIG. 4, FIG. 6 illustrates a cross-section of FIG. 6 along the sectional line AA', and FIG. 7 illustrates a cross-section of FIG. 6 along the sectional line BB'. As shown in FIGS. 5-7, an etching process is conducted to remove part of the dielectric material 36 so that the top surface of the dielectric material 36 is even with or slightly lower than the top surface of the buffer layer 38. Preferably, the dielectric material 36 deposited into the first recess 32 and second recess 34 becomes a single diffusion break (SDB) structure for separating the fin-shaped structures 18 and fin-shaped structures 20.

Moreover, according to an embodiment of the present invention, it would also be desirable to first not removing the patterned hard mask 24 after forming the first recess 32 and second recess 34 in FIG. 3, and then forming the dielectric material 36 on the patterned hard mask 24 while filling the dielectric material 36 into the first recess 32 and the second recess 34 in FIG. 4. Next, a planarizing process such as CMP is conducted to remove the entire patterned hard mask 24 while part of the dielectric material 36 is removed so that the top surface of the remaining dielectric material 36 is even with the top surface of the buffer layer 38.

Next, standard transistor fabrication process could be carried out by removing part of the STI 22 so that the top surface of the STI 22 becomes slightly lower than the fin-shaped structures 18, 20, forming a gate structure on the fin-shaped structures, forming spacer on the sidewalls of the gate structure, and forming source/drain region in the fin-shaped structure adjacent to two sides of the spacer. Since the aforementioned fabrication process is well known to those skilled in the art, the details of which are not explained herein for the sake of brevity.

Figure 8:
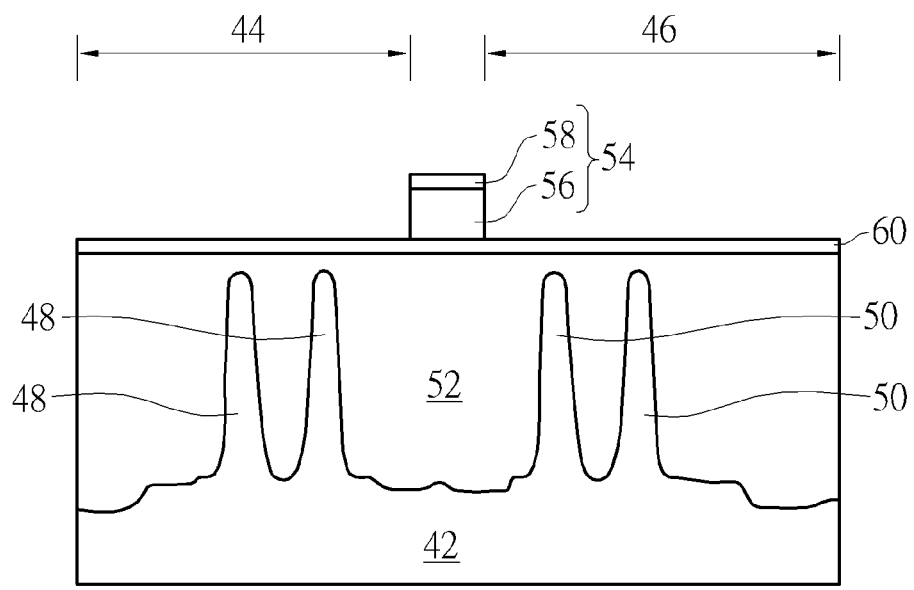
FIGS. 8-12 illustrate a method for fabricating semiconductor device according to a second embodiment of the present invention.

Referring to FIGS. 8-12, FIGS. 8-12 illustrate a method for fabricating semiconductor device according to a second embodiment of the present invention. As shown in FIG. 8, a substrate 42, such as a silicon substrate or silicon-on-insulator (SOI) substrate is first provided. Next, a first region 44 and a second region 46 are defined on the substrate 42, and multiple fin-shaped structures 48 and 50 are formed on the substrate 42 on both first region 44 and second region 46.

Similar to the first embodiment, the number, size, or even position of the fin-shaped structures disposed on the first region 44 could be the same as or different from the fin-shaped structures disposed on the second region 46. For instance, instead of forming two fin-shaped structures 48 on the first region 44 and two fin-shaped structures 50 on the second region 46 as disclosed in this embodiment, the quantity of the fin-shaped structures on each of the regions 44 and 46 could all be adjusted depending on the demand of the product.

Next, a shallow trench isolation (STI) 52 is formed around the fin-shaped structures 48, 50. In this embodiment, the formation of the STI 52 could be accomplished by conducting a flowable chemical vapor deposition (FCVD) process to form a silicon oxide layer on the substrate 42 and covering the fin-shaped structures 48, 50 entirely. Next, an etching process or a chemical mechanical polishing (CMP) process is conducted to remove part of the silicon oxide layer so that the top surface of the remaining silicon oxide is even with or slightly higher than the top surface of the fin-shaped structures 48, 50 for forming a STI 52.

Next, an ion implantation process is conducted to implant n-type or p-type dopants into the fin-shaped structures 48, 50, and an anneal process is accompanied to diffuse the implanted dopants for forming well regions (not shown).

Next, a buffer layer 60 and a patterned hard mask 54 is formed on the STI 52, in particularly on portion of the STI 52 between the first region 44 and second region 46 or between the fin-shaped structure 48 and fin-shaped structure 50. In this embodiment, the patterned hard mask 54 is preferably made of dielectric material, such as a material selected from the group consisting of silicon nitride and silicon oxide. More specifically, the patterned hard mask 54 is a dual-layer structure including a patterned silicon nitride layer 56 and a patterned silicon oxide layer 58. It should be noted that even though the patterned hard mask 54 of this embodiment pertains to a dual dielectric layer structure, the number and order for stacking the dielectric layers are not limited to the ones disclose in this embodiment. For instance, it would also be desirable to form a single dielectric layer to be used as the patterned hard mask 54 or two or more dielectric layers as the patterned hard mask 54, in which the dielectric layer stacks could be made of material selected from the group consisting of silicon nitride, silicon oxide, silicon oxynitride, and silicon carbon nitride, which are all within the scope of the present invention.

Figure 9:
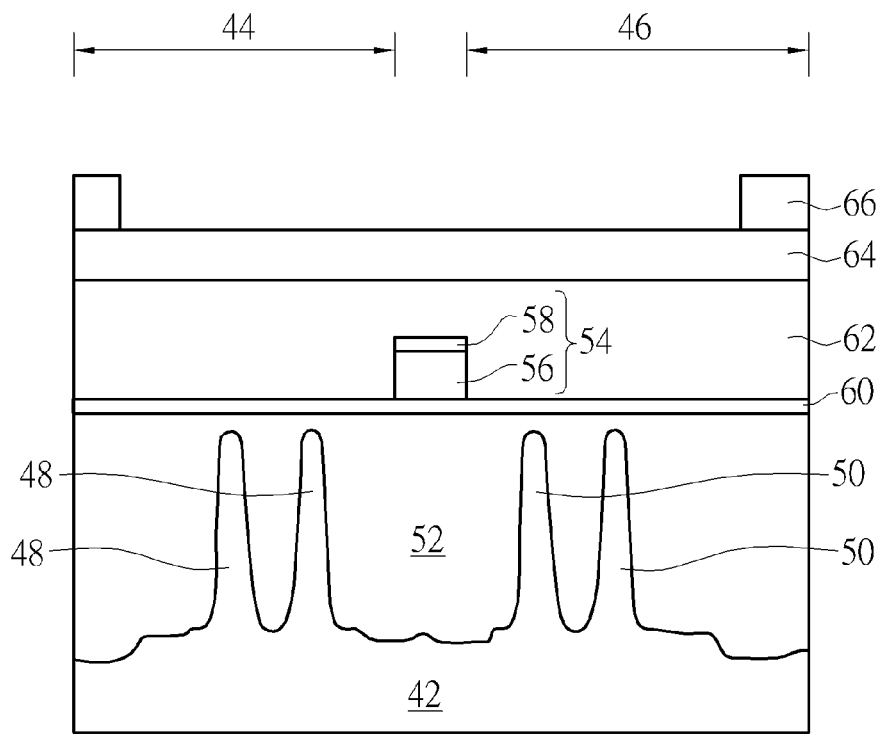

Next, as shown in FIG. 9, a mask layer is formed by sequentially forming an organic dielectric layer (ODL) 62, a silicon-containing hard mask bottom anti-reflective coating (SHB) layer 64, and a patterned resist 66 on the buffer layer 60 to cover the patterned hard mask 54.

Figure 10:
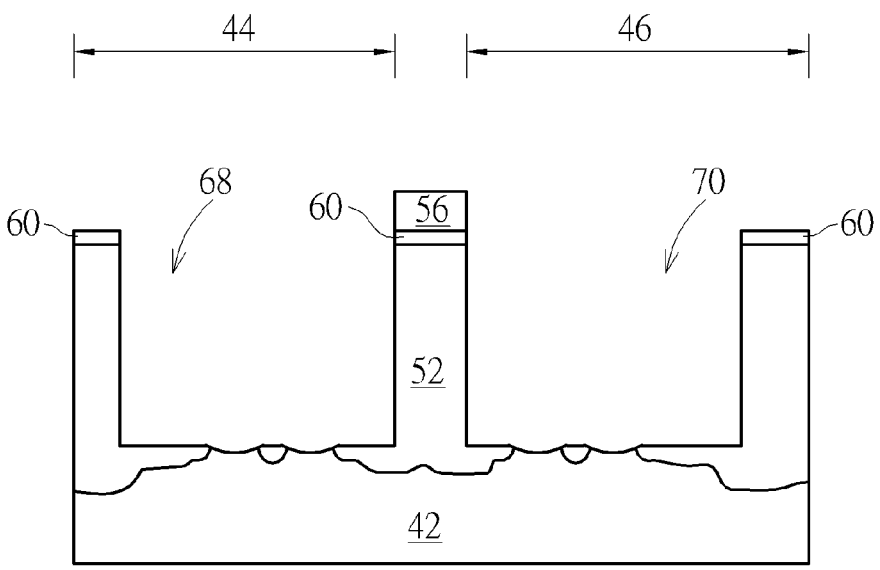

Next, as shown in FIG. 10, an etching process is conducted by using the patterned resist 66 to remove part of the SHB layer 64, part of the ODL 62, part of the buffer layer 60, part of the fin-shaped structure 48 and part of STI 52 on one side of the patterned hard mask 54, and part of the fin-shaped structure 50 and part of STI 52 on another side of the patterned hard mask 54. This forms a first recess 68 on one side of the patterned hard mask 54 and a second recess 70 on the other side of the patterned hard mask 54. It should be noted that the silicon oxide layer 58 from the patterned hard mask 54 may be removed during the formation of the first recess 68 and second recess 70 so that only the silicon nitride layer 56 would remain on the buffer layer 60 between the first region 44 and second region 46 after the first recess 68 and second recess 70 are formed.

Figure 11:
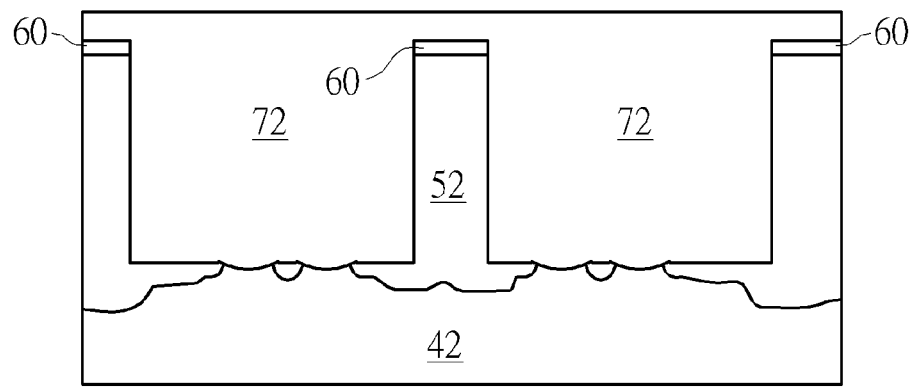

Next, as shown in FIG. 11, an etching process could be conducted by using etchant such as phosphoric acid ($H_3PO_4$) to completely remove the patterned hard mask 54 or silicon nitride layer 56 and expose the surface of the buffer layer 60 between the first region 44 and second region 46. Next, a dielectric material 72 is deposited into the first recess 68 and second recess 70, in which dielectric material 72 preferably fills the first recess 68 and second recess 70 completely and the top surface of the dielectric material 72 is higher than the top surface of the buffer layer 60. In this embodiment, the dielectric material 72 and STI 52 are preferably made of different material. For instance, the dielectric material 72 filled into the first recess 68 and second recess 70 preferably includes silicon nitride and the STI 52 includes silicon oxide, but not limited thereto.

Figure 12:
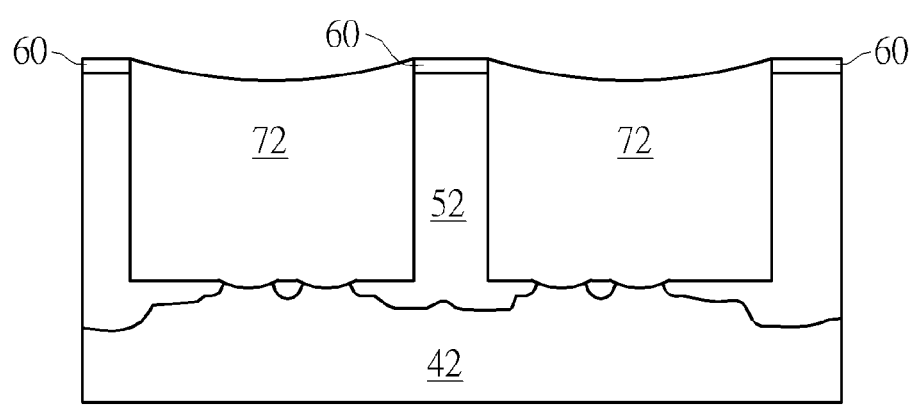

Next, as shown in FIG. 12, an etching process could be conducted following the steps shown in FIGS. 5-7 to remove part of the dielectric material 72 so that the top surface of the dielectric material 72 is even with or slightly lower than the top surface of the buffer layer 60. Preferably, the dielectric material 72 deposited into the first recess 68 and second recess 70 becomes a single diffusion break (SDB) structure for separating the fin-shaped structures 48 and fin-shaped structures 50.

Moreover, according to an embodiment of the present invention, it would also be desirable to first not removing the patterned hard mask 54 after forming the first recess 68 and second recess 70 in FIG. 10, and then forming the dielectric material 72 on the patterned hard mask 54 while filling the dielectric material 72 into the first recess 68 and the second recess 70 in FIG. 11. Next, a planarizing process such as CMP is conducted to remove the entire patterned hard mask 54 while part of the dielectric material 72 is removed so that the top surface of the remaining dielectric material 72 is even with the top surface of the buffer layer 60.

Next, standard transistor fabrication process could be carried out by removing part of the STI 52 so that the top surface of the STI 52 becomes slightly lower than the fin-shaped structures 48, 50, forming a gate structure on the fin-shaped structures, forming spacer on the sidewalls of the gate structure, and forming source/drain region in the fin-shaped structure adjacent to two sides of the spacer. Since the standard transistor fabrication process is well known to those skilled in the art, the details of which are not explained herein for the sake of brevity.

Overall, the present invention discloses a novel SDB process by first forming a patterned hard mask composed of either conductive material or dielectric layer on a STI, and then using the patterned hard mask to remove part of the fin-shaped structure and part of the STI adjacent to two sides of the patterned hard mask for forming two recesses. Dielectric material is then deposited into the recesses to form SDB structures. By using the SDB process disclose in the aforementioned embodiments, it would be desirable to reduce the risk of SDB structures from merging with adjacent SDB structures through improved lithography window and provide better control for the critical dimensions between fin-shaped structures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a first fin-shaped structure and a second fin-shaped structure on a substrate;
   forming a shallow trench isolation (STI) around the first fin-shaped structure and the second fin-shaped structure;
   forming a patterned hard mask on the STI;
   removing part of the first fin-shaped structure and part of the second fin-shaped structure adjacent to two sides of the patterned hard mask and part of the STI around the first fin-shaped structure and the second fin-shaped structure for forming a first recess and a second recess; and
   forming a dielectric material into the first recess and the second recess.

2. The method of claim 1, further comprising:
   forming the patterned hard mask on the STI between the first fin-shaped structure and the second fin-shaped structure; and
   removing part of the first fin-shaped structure and part of the STI adjacent to one side of the patterned hard mask for forming the first recess and removing part of the second fin-shaped structure and part of the STI adjacent to another side of the patterned hard mask for forming the second recess.

3. The method of claim 1, further comprising:
   removing the patterned hard mask after forming the first recess and the second recess;
   forming the dielectric material into the first recess and the second recess; and
   performing an etching process to remove part of the dielectric material so that the top surfaces of the dielectric material and the STI are coplanar.

4. The method of claim 1, further comprising:
   performing a planarizing process to remove the patterned hard mask and part of the dielectric material so that the top surfaces of the dielectric material and the STI are coplanar.

5. The method of claim 1, further comprising:
forming a mask layer on the STI and the patterned hard mask;
forming a patterned resist on the mask layer; and
using the patterned resist as mask to remove part of the mask layer, part of the STI, part of the first fin-shaped structure, and part of the second fin-shaped structure adjacent to two sides of the patterned hard mask.

6. The method of claim 1, wherein the patterned hard mask comprises conductive material.

7. The method of claim 6, wherein the patterned hard mask comprises TiN.

8. The method of claim 1, wherein the patterned hard mask is selected from the group consisting of silicon nitride and silicon oxide.

9. The method of claim 1, wherein the dielectric material and the STI comprise different material.

10. The method of claim 1, wherein the dielectric material comprises silicon nitride.

\* \* \* \* \*